(12) United States Patent
Kang et al.

(10) Patent No.: US 6,969,668 B1
(45) Date of Patent: Nov. 29, 2005

(54) TREATMENT METHOD OF FILM QUALITY FOR THE MANUFACTURE OF SUBSTRATES

(75) Inventors: Sien G. Kang, Pleasanton, CA (US); Igor J. Malik, Palo Alto, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 09/710,628

(22) Filed: Nov. 8, 2000

Related U.S. Application Data

(63) Continuation of application No. 09/295,858, filed on Apr. 21, 1999, now Pat. No. 6,171,965.

(51) Int. Cl.$^7$ .......................... H01L 21/46; H01L 21/11; H01L 21/311
(52) U.S. Cl. ...................... 438/458; 438/695; 438/706; 438/734; 148/DIG. 12; 216/52
(58) Field of Search ................... 438/458, 695, 438/706, 734; 148/DIG. 12; 216/52

(56) References Cited

U.S. PATENT DOCUMENTS

| | | | |
|---|---|---|---|
| 3,964,957 A | 6/1976 | Walsh ..................... 156/345 |
| 4,495,219 A | 1/1985 | Kato et al. ................ 427/82 |
| 4,530,149 A | 7/1985 | Jastrzebski et al. | |
| 4,906,594 A | 3/1990 | Yoneda et al. ............ 437/228 |
| 5,141,878 A | 8/1992 | Benton et al. | |
| 5,198,071 A | 3/1993 | Scudder et al. ........... 156/625 |
| 5,198,371 A | 3/1993 | Li ........................... 437/11 |
| 5,213,986 A | 5/1993 | Pinker et al. ............. 437/20 |
| 5,374,564 A | 12/1994 | Bruel ...................... 437/24 |
| 5,409,563 A | 4/1995 | Cathey | |
| 5,427,052 A | 6/1995 | Ohta et al. | |
| 5,494,835 A | 2/1996 | Bruel | |
| 5,506,176 A | 4/1996 | Takizawa | |
| 5,508,207 A | 4/1996 | Horai et al. | |
| 5,518,965 A | 5/1996 | Menigaux et al. | |
| 5,559,043 A | 9/1996 | Bruel | |
| 5,686,980 A | 11/1997 | Hirayama et al. ........ 349/110 |

(Continued)

FOREIGN PATENT DOCUMENTS

EP            553 852 A2    8/1993

(Continued)

OTHER PUBLICATIONS

Moriceau et al., "Hydrogen annealing treatment used to obtain high quality SOI surfaces," *Proceedings of 1998 IEEE Int. SOI Conference*, pp. 37-38 from conference held Oct. 5-8, 1998.

(Continued)

*Primary Examiner*—Long Pham
*Assistant Examiner*—Shrinivas H. Rao
(74) *Attorney, Agent, or Firm*—Townsend and Townsend and Crew LLP

(57) ABSTRACT

A method of fabricating substrates, e.g., bulk wafers, silicon on insulator wafers, silicon on saphire, optoelectronic substrates. The method includes providing a substrate (e.g., silicon, gallium arsenide, gallium nitride, quartz). The substrate has a film characterized by a non-uniform surface, which includes a plurality of defects. At least some of the defects are of a size ranging from about 100 Angstroms and greater. The method also includes applying a combination of a deposition species for deposition of a deposition material and an etching species for etching etchable material. The combination of the deposition species and the etching species contact the non-uniform surface in a thermal setting to reduce a level of non-uniformity of the non-uniform surface by filling a portion of the defects to smooth the film of material. The smoothed film of material is substantially free from the defects and is characterized by a surface roughness of a predetermined value.

23 Claims, 11 Drawing Sheets

U.S. PATENT DOCUMENTS

| | | | |
|---|---|---|---|
| 5,705,421 A | 1/1998 | Matsushita et al. | |
| 5,714,395 A | 2/1998 | Bruel | |
| 5,841,931 A | 11/1998 | Foresi et al. | |
| 5,854,123 A | 12/1998 | Sato et al. | |
| 5,869,387 A | 2/1999 | Sato et al. | 438/459 |
| 5,869,405 A | 2/1999 | Gonzalez et al. | |
| 5,877,070 A | 3/1999 | Goesele et al. | |
| 5,966,620 A | 10/1999 | Sakaguchi et al. | |
| 5,966,625 A | 10/1999 | Zhong et al. | |
| 5,968,279 A | 10/1999 | MacLeish et al. | |
| 6,004,868 A | 12/1999 | Rolfson et al. | |
| 6,008,128 A | 12/1999 | Habuka et al. | 438/695 |
| 6,107,213 A | 8/2000 | Tayanaka | |
| 6,143,628 A | 11/2000 | Sato et al. | |
| 6,162,705 A | 12/2000 | Henley et al. | |
| 6,171,965 B1 | 1/2001 | Kang et al. | |
| 6,171,982 B1 | 1/2001 | Sato | |
| 6,194,327 B1 | 2/2001 | Gonzalez et al. | |
| 6,204,151 B1 | 3/2001 | Malik et al. | |
| 6,214,701 B1 | 4/2001 | Matsushita et al. | |
| 6,251,754 B1 | 6/2001 | Ohshima et al. | |
| 6,274,464 B2 | 8/2001 | Drobny et al. | |
| 6,287,941 B1 | 9/2001 | Kang et al. | |
| 6,342,436 B1 | 1/2002 | Takizawa | |

FOREIGN PATENT DOCUMENTS

| | | |
|---|---|---|
| EP | 905 767 A1 | 3/1999 |
| EP | 961 312 A2 | 12/1999 |
| JP | 2000-94317 A | 4/2000 |

OTHER PUBLICATIONS

Sato et al., "Suppression of Si etching during hydrogen annealing of silicon-on-insulator," *Proceedings of 1998 IEEE Int. SOI Conference*, pp.17-18 from conference held Oct. 5-8, 1998.

Tate et al., "Defect reduction of bonded SOI wafers by post anneal process in H/sub 2/ ambient," *Proceedings of 1998 IEEE Int. SOI Conference*, pp. 141-142 from conference held Oct. 5-8, 1998.

Mahajan et al., *Principles of Growth and Processing of Semiconductors*, WCB McGraw-Hill, chapter 6, pp. 262-269.

Smith, D.L., *Thin-Film Deposition*, McGraw-Hill, Inc., pp. 185-196, 278-293.

Tong et al., *Semiconductor Wafer Bonding: Science and Technology*, John Wiley & Sons, Inc., pp. 152-171.

Websters Dictionary, Tenth edition, p. 388 (1998).

TREATMENT METHOD OF FILM QUALITY FOR THE MANUFACTURE OF SUBSTRATES

CROSS-REFERENCES TO RELATED APPLICATIONS

The present invention is a continuation of and claims priority to U.S. application Ser. No. 09/295,858 filed Apr. 21, 1999, now U.S. Pat. No. 6,171,965, commonly assigned and hereby incorporated by reference for all purposes.

BACKGROUND OF THE INVENTION

The present invention relates to the manufacture of objects. More particularly, the present invention provides a technique for improving surface texture or surface characteristics of a film of material, e.g., silicon, silicon germanium, or others. The present invention can be applied to treating or smoothing a cleaved film from a layer transfer process for the manufacture of integrated circuits, for example. The invention can also be applied to treating a film of material to fill a defect (e.g., hydrofluoric acid ("HF") defect, pin hole, crystalline defect) in the film for the manufacture of integrated circuits, for example. But it will be recognized that the invention has a wider range of applicability; it can also be applied to smoothing a film for other substrates such as multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), doping semiconductor devices, biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration ("VLSI") or ultra-large scale integration ("ULSI") is by using a semiconductor-on-insulator ("SOI") wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Many problems, however, that have already been solved regarding fabricating devices on bulk silicon wafers remain to be solved for fabricating devices on SOI wafers.

For example, SOI wafers generally must also be polished to remove any surface irregularities from the film of silicon overlying the insulating layer. Polishing generally includes, among others, chemical mechanical polishing, commonly termed CMP. CMP is generally time consuming and expensive, and can be difficult to perform cost efficiently to remove surface non-uniformities. That is, a CMP machine is expensive and requires large quantities of slurry mixture, which is also expensive. The slurry mixture can also be highly acidic or caustic. Accordingly, the slurry mixture can influence functionality and reliability of devices that are fabricated on the SOI wafer.

From the above, it is seen that an improved technique for manufacturing a substrate such as an SOI wafer is highly desirable.

SUMMARY OF THE INVENTION

According to the present invention, a technique for treating a film of material is provided. More particularly, the present invention provides a method for treating a defective film using a combination of thermal treatment and chemical reaction, which can form a substantially smooth defect free film layer for the manufacture of integrated circuits, for example.

In a specific embodiment, the present invention provides a method of fabricating substrates, e.g., bulk wafers, silicon on insulator wafers, silicon on saphire, optoelectronic substrates. The method includes providing a substrate (e.g., silicon, gallium arsenide, gallium nitride, quartz). The substrate has a film characterized by a non-uniform surface, which includes a plurality of defects, e.g., hydrofluoric acid ("HF") defect, pin hole, crystalline defect. At least some of the defects are of a size ranging from about 100 Angstroms and greater, but may be less. The method also includes applying a combination of a deposition species for deposition of a deposition material and an etching species for etching etchable material. The combination of the deposition species and the etching species contact the non-uniform surface in a thermal setting to reduce a level of non-uniformity of the non-uniform surface by filling a portion of the defects to smooth the film of material. The smoothed film of material is substantially free from the defects and is characterized by a surface roughness of a predetermined value.

Numerous benefits are achieved by way of the present invention over pre-existing techniques. For example, the present invention provides an efficient technique for forming a substantially uniform surface on an SOI wafer. Additionally, the substantially uniform surface is made by way of common hydrogen treatment, deposition, and etching techniques, which can be found in conventional epitaxial tools. Furthermore, the present invention provides a novel uniform layer, which can be ready for the manufacture of integrated circuits. The present invention also relies upon standard fabrication gases such as HCl and hydrogen gas. In preferred embodiments, the present invention can improve bond interface integrity, improve crystal structure, and reduce defects (e.g., HF) in the substrate simultaneously during the process. Depending upon the embodiment, one or more of these benefits is present. These and other advantages or benefits are described throughout the present specification and are described more particularly below.

These and other embodiments of the present invention, as well as its advantages and features are described in more detail in conjunction with the text below and attached Figs.

DESCRIPTION OF THE SPECIFIC EMBODIMENT

According to the present invention, a technique for treating a film of material is provided. More particularly, the present invention provides a method for treating a defective film using a combination of thermal treatment and chemical reaction, which can form a substantially smooth defect free film layer for the manufacture of integrated circuits, for example. The invention will be better understood by reference to the Figs. and the descriptions below.

Figure 1:
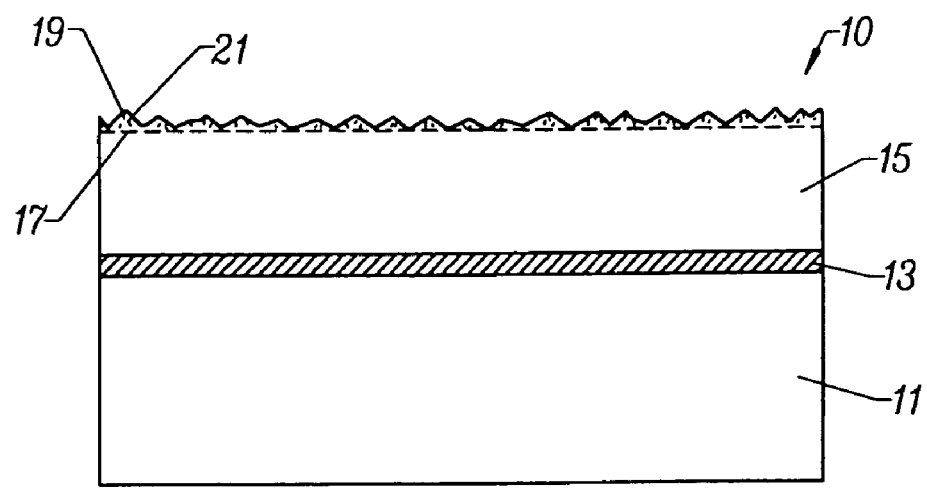
FIGS. 1–11 are simplified diagrams illustrating a controlled cleaving technique according to an embodiment of the present invention.

FIG. 1 is a simplified cross-sectional view diagram of a substrate 10 according to the present invention. The diagram is merely an illustration and should not limit the scope of the claims herein. As merely an example, substrate 10 is a silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the silicon wafer. The present invention provides a novel technique for removing the material region 12 using the following sequence of steps.

Selected energetic particles implant 22 through the top surface 14 of the silicon wafer to a selected depth 24, which defines the thickness 20 of the material region 12, termed the thin film of material. A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion implantation techniques are described in "Recent Applications of Plasma Immersion Ion Implantation," Paul K. Chu, Chung Chan, and Nathan W. Cheung, SEMICONDUCTOR INTERNATIONAL, pp. 165–172, June 1996, and "Plasma Immersion Ion Implantation—A Fledgling Technique for Semiconductor Processing,", P. K. Chu, S. Qin, C. Chan, N. W. Cheung, and L. A. Larson, MATERIAL SCIENCE AND ENGINEERING REPORTS, A Review Journal, pp. 207–280, Volume R17, Nos. 6–7, (Nov. 30, 1996), which are both hereby incorporated by reference for all purposes. Furthermore, implantation can occur using ion shower. Of course, techniques used depend upon the application.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

In other embodiments, the particles can be introduced by way of injection. That is, the particles can be introduced to a selected region of the substrate by diffusion. Alternatively, the particles can be introduced by a combination of implantation and diffusion. Still further, the particles can be larger sized, such as silicon or the like. The particles can be smaller and larger sized, depending upon the application. The particles can be almost any suitable species that can be effectively introduced into the selected region for cleaving purposes.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about −200 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of substrate at all internal locations is insufficient to initiate a non-reversible fracture (i.e., separation or cleaving) in the substrate material. It should be noted, however, that implantation may cause a certain amount of defects (e.g., micro-detects) in the substrate that can be repaired by subsequent heat treatment, e.g., thermal annealing or rapid thermal annealing.

FIG. 1A is a simplified particle distribution diagram 250 according to an embodiment of the present invention. The diagram is merely an example that should not limit the scope of the claims herein. One of ordinary skill in the art would recognize other variations, modifications, and alternatives. The diagram 250 shows concentration of particles, which is on the vertical axis, against spatial distribution along a depth of the substrate, which is on the horizontal axis. As shown, the spatial distribution ranges from the top 253 of the substrate to the selected depth ($z_o$) to the bottom of the substrate 257. The concentration distribution is shown by the line 251, which has a maximum value 253. The maximum value is defined as $C_{MAX}$ 259. The maximum value is defined at the selected depth. Depending upon the embodiment, other implant profiles can also be provided.

Figure 2:
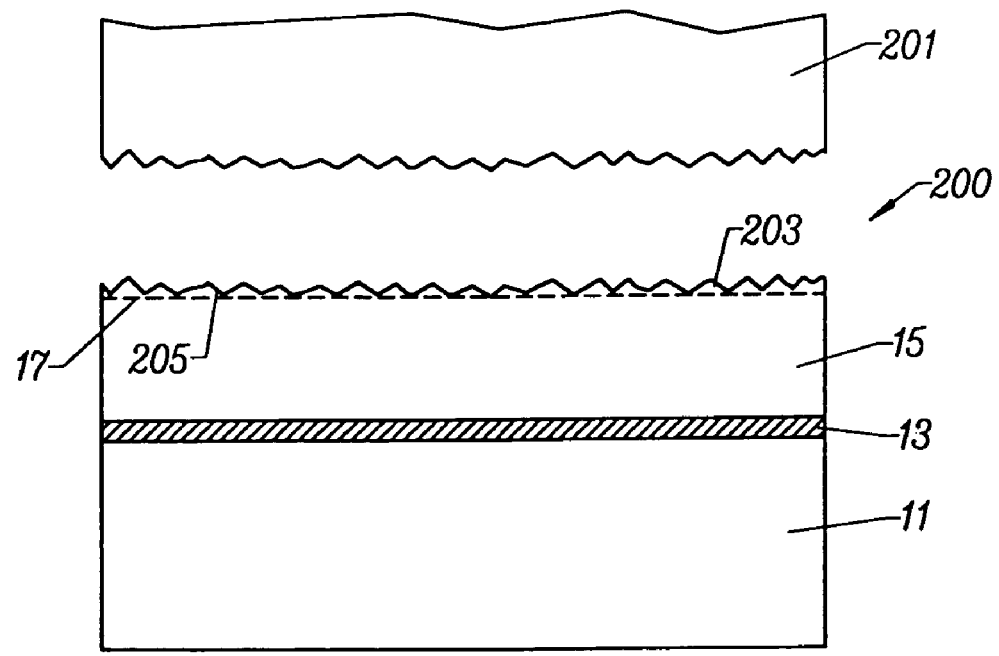

FIG. 2 is a simplified energy diagram 200 along a cross-section of the implanted substrate 10 according to the present invention. The diagram is merely an illustration and should not limit the scope of the claims herein. The simplified diagram includes a vertical axis 201 that represents an energy level (E) (or additional energy) to cause a cleave in the substrate. A horizontal axis 203 represents a depth or distance from the bottom of the wafer to the top of the wafer. After implanting particles into the wafer, the substrate has an average cleave energy represented as E 205, which is the amount of energy needed to cleave the wafer along various cross-sectional regions along the wafer depth. The cleave energy ($E_c$) is equal to the bulk material fracture energy ($E_{mat}$) in non-implanted regions. At the selected depth 20, energy ($E_{cz}$) 207 is lower since the implanted particles essentially break or weaken bonds in the crystalline structure (or increase stress caused by a presence of particles also contributing to lower energy ($E_{cz}$) 207 of the substrate) to lower the amount of energy needed to cleave the substrate at the selected depth. The present invention takes advantage of the lower energy (or increased stress) at the selected depth to cleave the thin film in a controlled manner.

Figure 3:
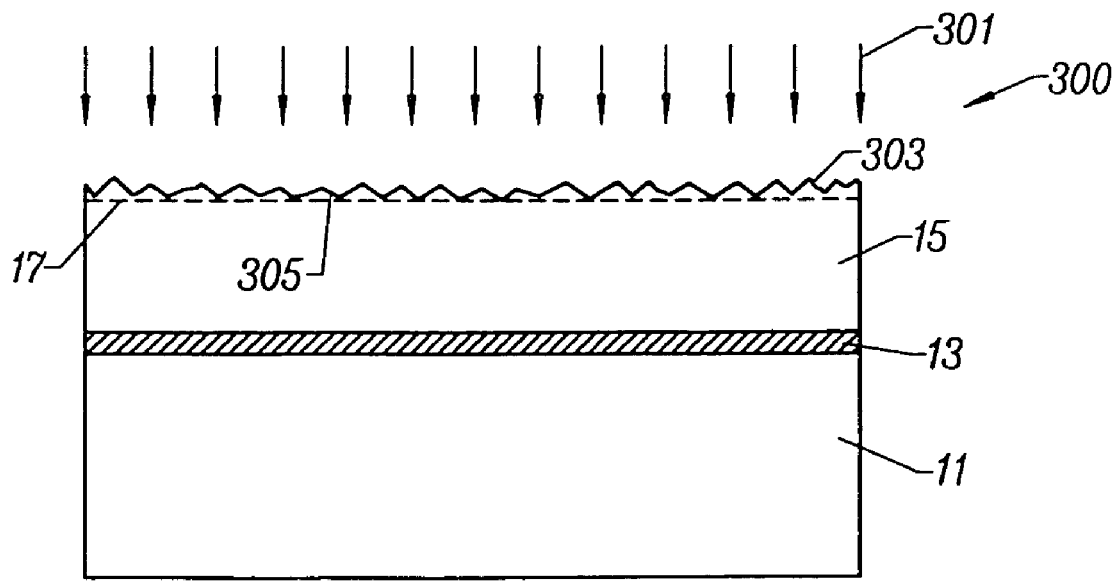
Figure 3A:
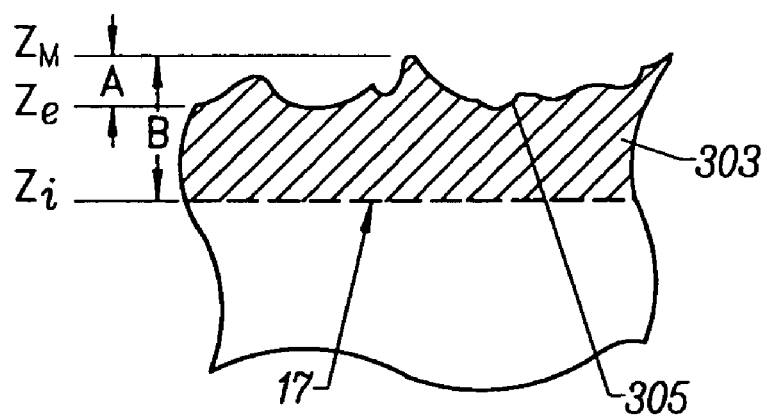

Substrates, however, are not generally free from defects or "weak" regions across the possible cleave front or selected depth zo after the implantation process. In these cases, the cleave generally cannot be controlled, since they are subject to random variations such as bulk material non-uniformities, built-in stresses, defects, and the like. FIG. 3 is a simplified energy diagram 300 across a cleave front for the implanted substrate 10 having these defects. The diagram 300 is merely an illustration and should not limit the scope of the claims herein. The diagram has a vertical axis 301 which represents additional energy (E) and a horizontal axis 303 which represents a distance from side 1 to side 2 of the substrate, that is, the horizontal axis represents regions along the cleave front of the substrate. As shown, the cleave front has two regions 305 and 307 represented as region 1 and region 2, respectively, which have cleave energies less than the average cleave energy ($E_{cz}$) 207 (possibly due to a higher concentration of defects or the like). Accordingly, it is highly likely that the cleave process begins at one or both of the above regions, since each region has a lower cleave energy than surrounding regions.

Figure 4:
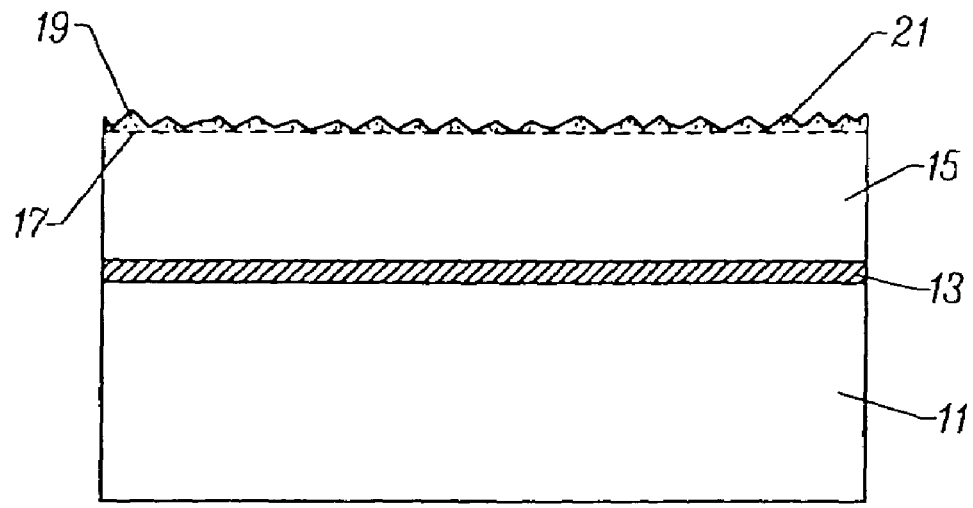

An example of a cleave process for the substrate illustrated by the above Fig. is described as follows with reference to FIG. 4. FIG. 4 is a simplified top-view diagram 400 of multiple cleave fronts 401, 403 propagating through the implanted substrate. The cleave fronts originate at "weaker" regions in the cleave plane, which specifically includes regions 1 and 2. The cleave fronts originate and propagate randomly as shown by the arrows. A limitation with the use of random propagation among multiple cleave fronts is the possibility of having different cleave fronts join along slightly different planes or the possibility of forming cracks, which is described in more detail below.

Figure 5:
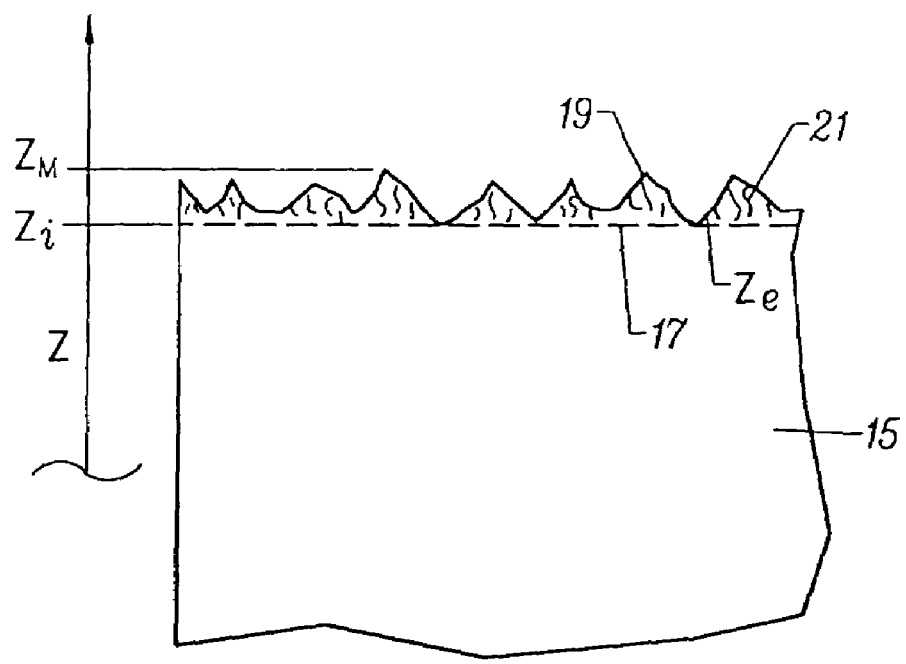

FIG. 5 is a simplified cross-sectional view 500 of a film cleaved from a wafer having multiple cleave fronts at, for example, regions 1 305 and 2 307. This diagram is merely an illustration and should not limit the scope of the claims herein. As shown, the cleave from region 1 joined with the cleave from region 2 at region 3 309, which is defined along slightly different planes, may initiate a secondary cleave or crack 311 along the film. Depending upon the magnitude of the difference 313, the film may not be of sufficient quality for use in manufacture of substrates for integrated circuits or other applications. A substrate having crack 311 generally cannot be used for processing. Accordingly, it is generally undesirable to cleave a wafer using multiple fronts in a random manner. An example of a technique which may form multiple cleave fronts in a random manner is described in U.S. Pat. No. 5,374,564, which is in the name of Michel Bruel ("Bruel"), and assigned to Commissariat A l'Energie Atomique in France. Bruel generally describes a technique for cleaving an implanted wafer by global thermal treatment (i.e., thermally treating the entire plane of the implant) using thermally activated diffusion. Global thermal treatment of the substrate generally causes an initiation of multiple cleave fronts which propagate independently. In general, Bruel discloses a technique for an "uncontrollable" cleaving action by way of initiating and maintaining a cleaving action by a global thermal source, which may produce undesirable results. These undesirable results include potential problems such as an imperfect joining of cleave fronts, an excessively rough surface finish on the surface of the cleaved material since the energy level for maintaining the cleave exceeds the amount required, and many others. The present invention overcomes the formation of random cleave fronts by a controlled distribution or selective positioning of energy on the implanted substrate.

Figure 6:
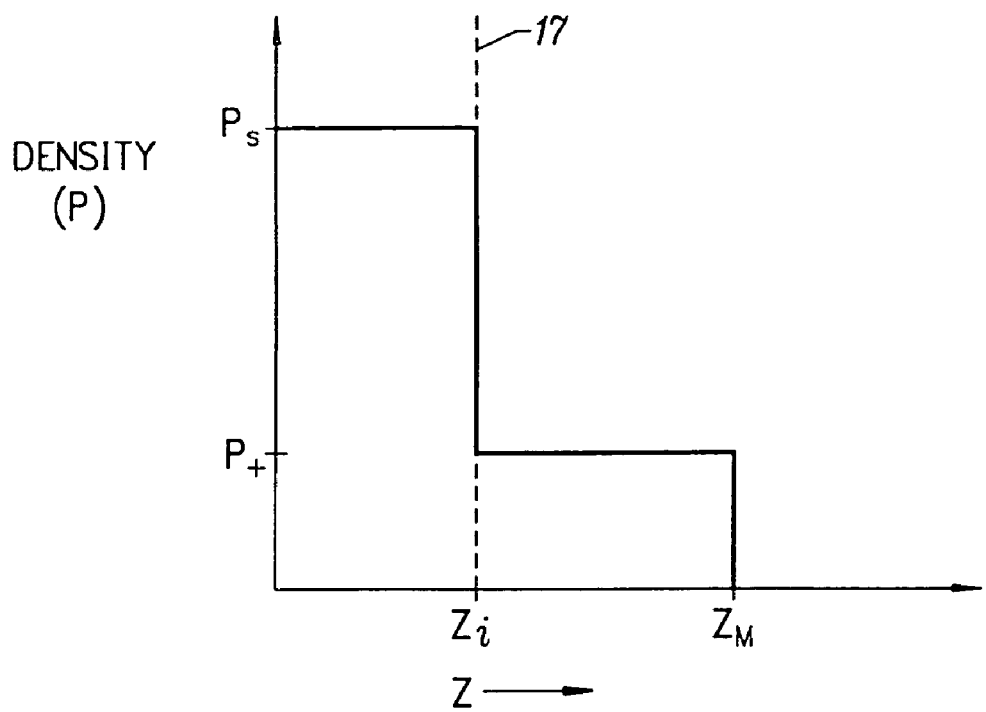

FIG. 6 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement 601 or positioning or targeting which provides a controlled cleaving action of the material region 12 at the selected depth 603. In preferred embodiments, selected energy placement 607 occurs near an edge or corner region of the selected depth 603 of substrate 10. The impulse (or impulses) is provided using energy sources. Examples of sources include, among others, a chemical source, a mechanical source, an electrical source, and a thermal sink or source. The chemical source can include a variety such as particles, fluids, gases, or liquids. These chemical sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, a furnace, and the like. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application.

Figure 6A:
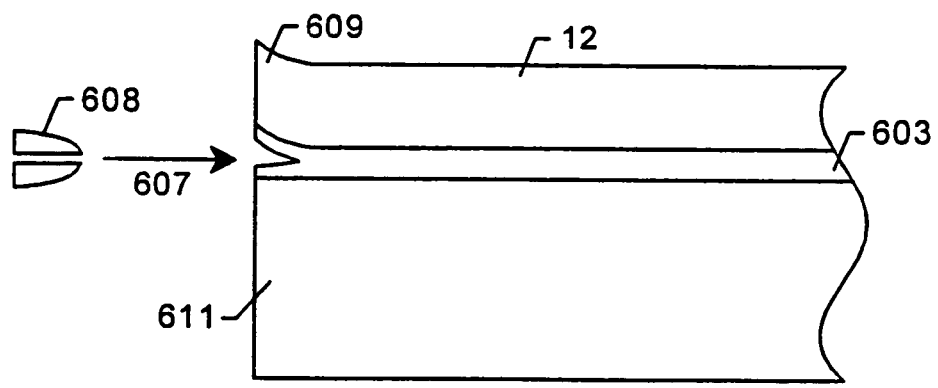

In a specific embodiment, the energy source can be a fluid jet that is pressurized (e.g., compressional) according to an embodiment of the present invention. FIG. 6A shows a simplified cross-sectional view diagram of a fluid jet from a fluid nozzle 608 used to perform the controlled cleaving process according to an embodiment of the present invention. The fluid jet 607 (or liquid jet or gas jet) impinges on an edge region of substrate 10 to initiate the controlled cleaving process. The fluid jet from a compressed or pressurized fluid source is directed to a region at the selected depth 603 to cleave a thickness of material region 12 from substrate 10 using force, e.g., mechanical, chemical, thermal. As shown, the fluid jet separates substrate 10 into two regions, including region 609 and region 611 that separate from each other at selected depth 603. The fluid jet can also be adjusted to initiate and maintain the controlled cleaving process to separate material 12 from substrate 10. Depending upon the application, the fluid jet can be adjusted in direction, location, and magnitude to achieve the desired controlled cleaving process. The fluid jet can be a liquid jet or a gas jet or a combination of liquid and gas.

Figure 6B:
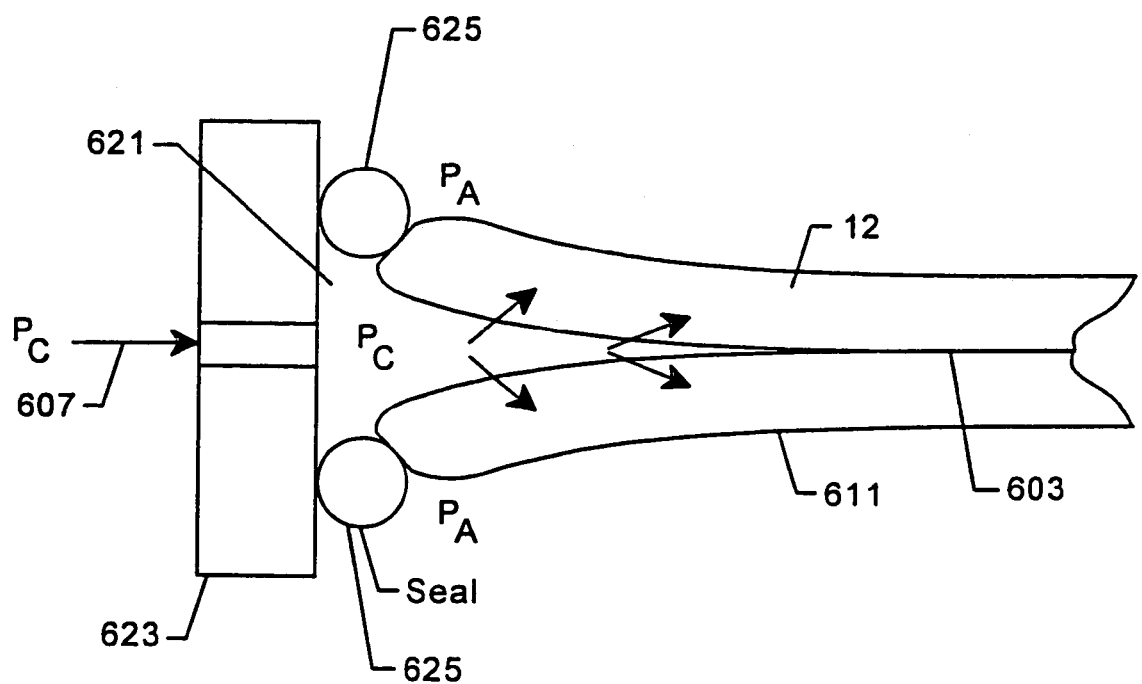
Figure 6C:
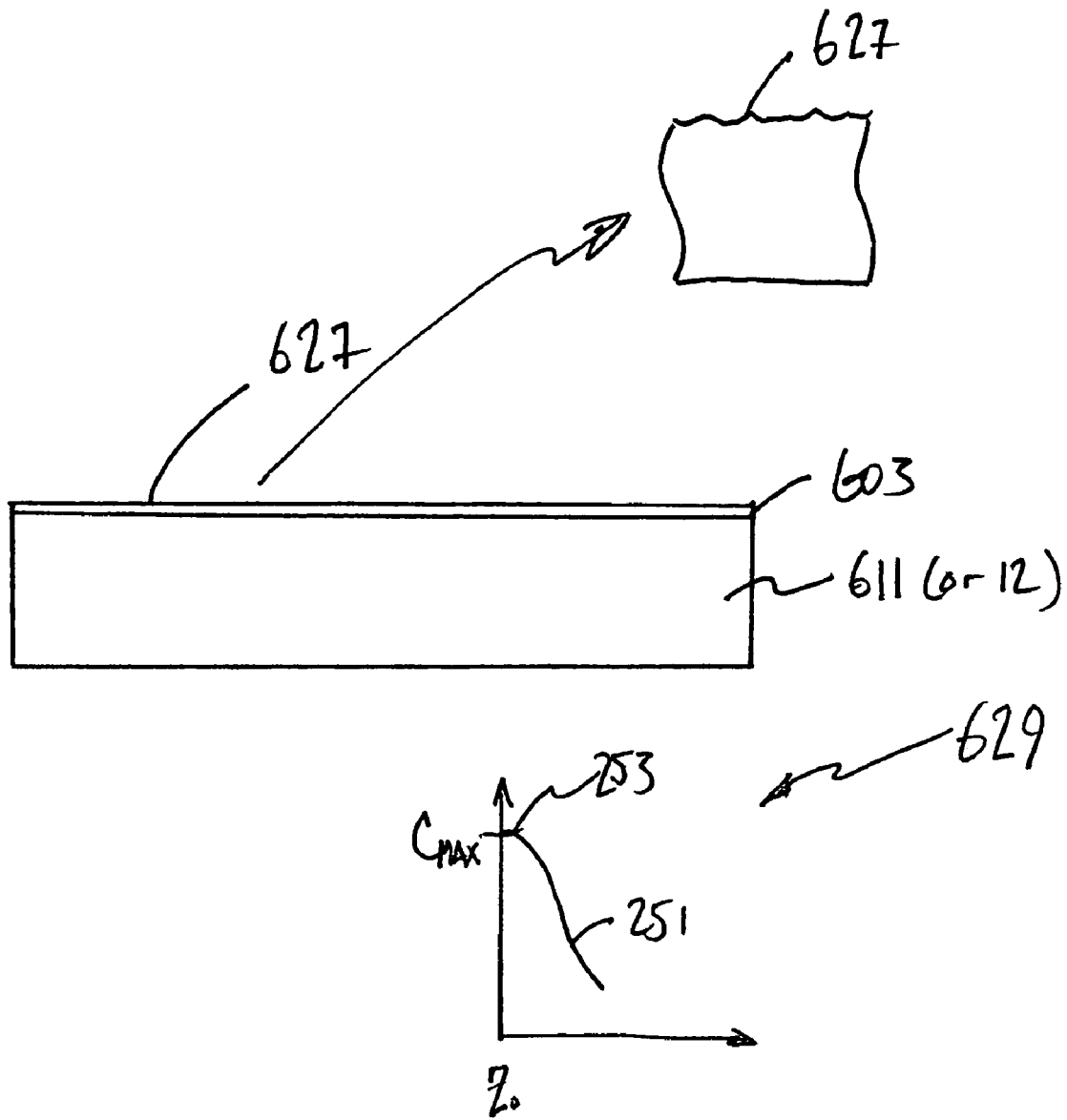

In a preferred embodiment, the energy source can be a compressional source such as, for example, compressed fluid that is static. FIG. 6B shows a simplified cross-sectional view diagram of a compressed fluid source 607 according to an embodiment of the present invention. The compressed fluid source 607 (e.g., pressurized liquid, pressurized gas) is applied to a sealed chamber 621, which surrounds a periphery or edge of the substrate 10. As shown, the chamber is enclosed by device 623, which is sealed by, for example, o-rings 625 or the like, and which surrounds the outer edge of the substrate. The chamber has a pressure maintained at PC that is applied to the edge region of substrate 10 to initiate the controlled cleaving process at the selected depth of implanted material. The outer surface or face of the substrate is maintained at pressure PA which can be ambient pressure, e.g., 1 atmosphere or less. A pressure differential exists between the pressure in the chamber, which is higher, and the ambient pressure. The pressure difference applies force to the implanted region at the selected depth 603. The implanted region at the selected depth is structurally weaker than surrounding regions, including any bonded regions. Force is applied via the pressure differential until the controlled cleaving process is initiated. The controlled cleaving process separates the thickness of material 609 from substrate material 611 to split the thickness of material from the substrate material at the selected depth. Additionally, pressure PC forces material region 12 to separate by a "prying action" from substrate material 611. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas.

In a specific embodiment, the present invention provides a resulting substrate 611, 12 that has a cleaved surface 627. The cleaved surface has a certain or predetermined amount of surface roughness. The surface roughness is often greater than that which is generally acceptable for manufacturing integrated circuits. In silicon wafers, for example, the surface roughness is generally about 10 nanometers root mean square ("RMS") or greater. Alternatively, the surface roughness is about 2–8 nanometers root mean square and greater. Each of the cleaved surfaces has a particle concentration, which is shown in the diagram in reference numeral 629. The concentration of particles at a maximum is generally at the selected depth ($z_o$). The particle concentration can be hydrogen, for example, or other hydrogen bearing compounds. The hydrogen bearing compound will assist in annealing the cleaved surface in later processing steps.

Figure 7:
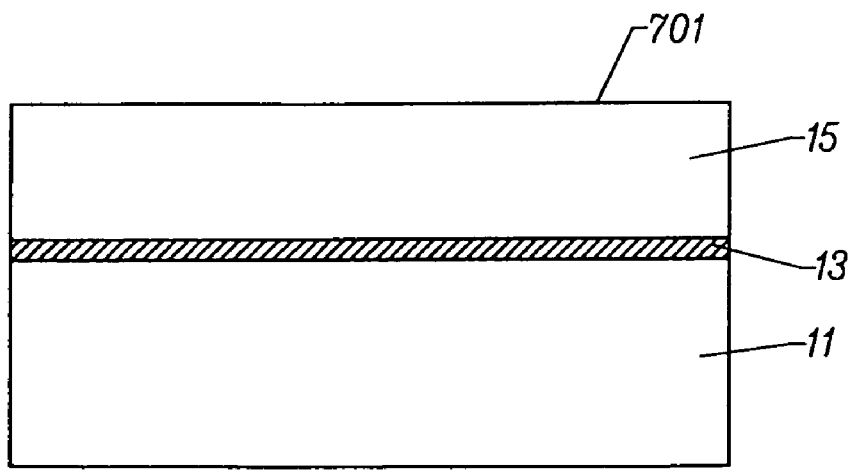

In a specific embodiment, the present invention provides a controlled-propagating cleave. The controlled-propagating cleave uses multiple successive impulses to initiate and perhaps propagate a cleaving process 700, as illustrated by FIG. 7. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 701 is directed to an edge 703 of the substrate to initiate the cleave action. Pulse 2 705 is also directed at the edge 707 on one side of pulse 1 to expand the cleave front. Pulse 3 709 is directed to an opposite edge 711 of pulse 1 along the expanding cleave front to further remove the material layer from the substrate. The combination of these impulses or pulses provides a controlled cleaving action 713 of the material layer from the substrate.

Figure 8:
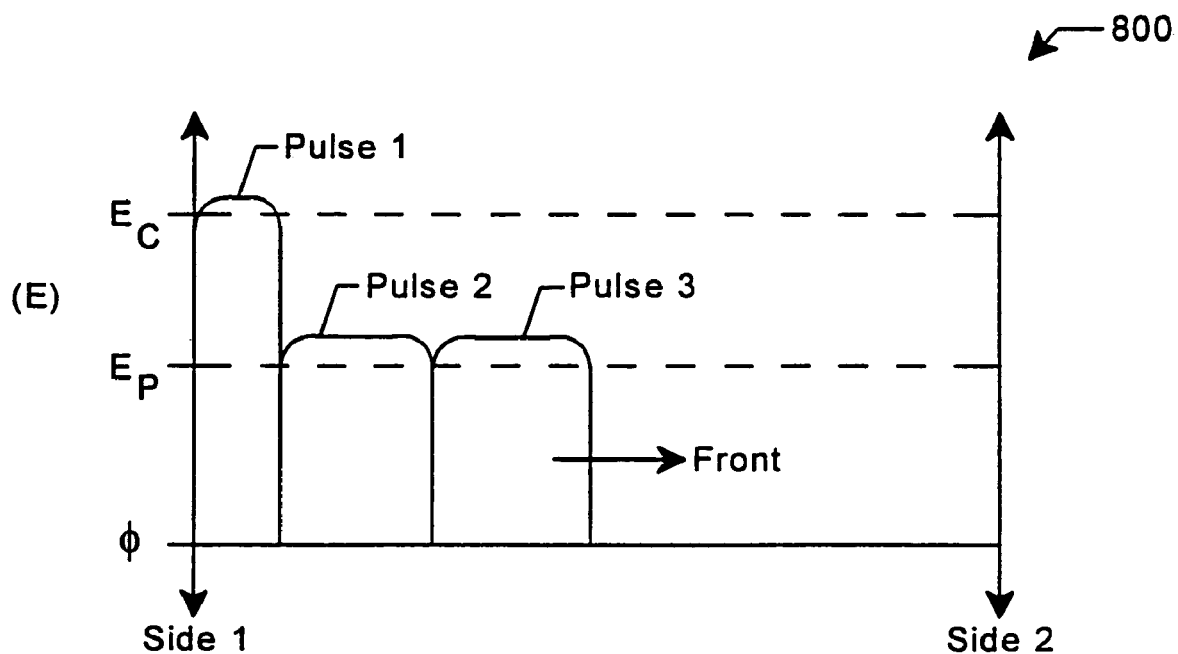

FIG. 8 is a simplified illustration of selected energies 800 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceed cleave energy formation or propagation energies. More preferably, the impinging beam cools and causes a thermal pulse gradient simultaneously, which exceed cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous.

In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action. These techniques are described by way of the Figs. below.

Figure 9:
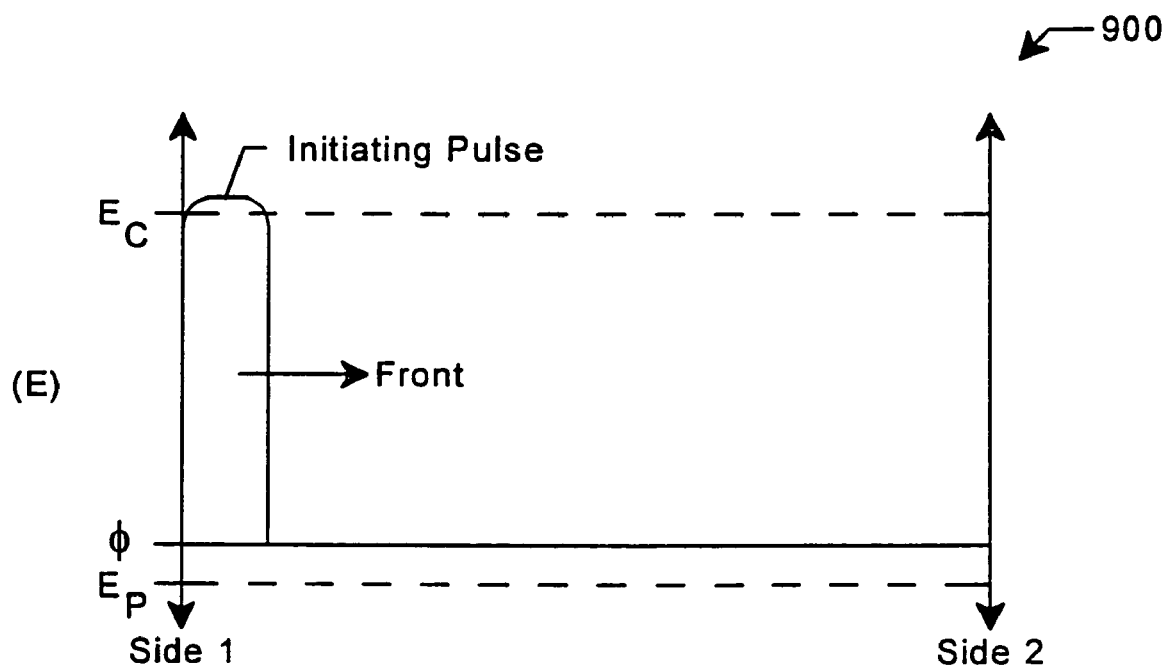

FIG. 9 is a simplified illustration of an energy state 900 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 10:
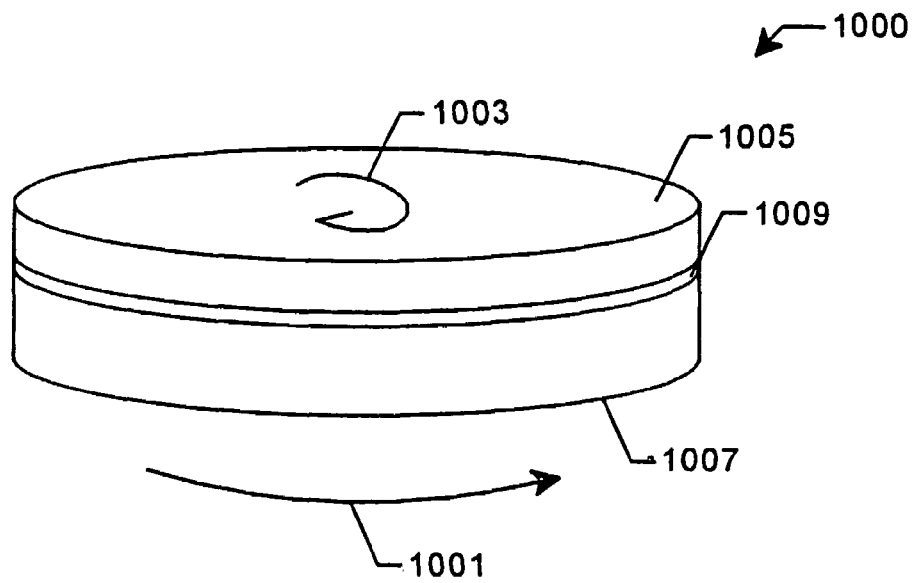
Figure 11:
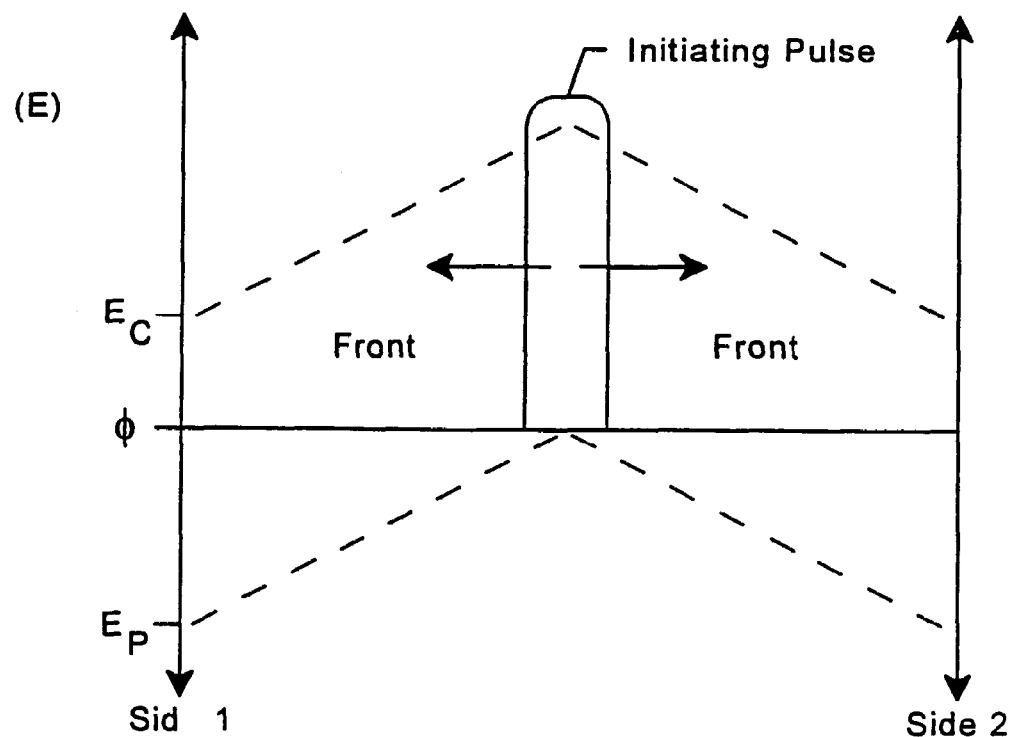

An alternative aspect of the invention is illustrated by FIGS. 10 and 11. FIG. 10 is a simplified illustration of an implanted substrate 1000 undergoing rotational forces 1001, 1003. This diagram is merely an illustration, and should not limit the scope of the claims herein. As shown, the substrate includes a top surface 1005, a bottom surface 1007, and an implanted region 1009 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 1001 on top surface and a rotational force turning counter-clockwise 1003 on the bottom surface which creates stress at the implanted region 1009 to initiate a cleave front. Alternatively, the top surface undergoes a counter-clockwise rotational force and the bottom surface undergoes a clockwise rotational force. Of course, the direction of the force generally does not matter in this embodiment.

FIG. 11 is a simplified diagram of an energy state 1100 for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the implanted region initiates the cleave front. In particular, rotational force applied to the implanted region of the substrates creates zero stress at the center of the substrate and greatest at the periphery, essentially being proportional to the radius. In this example, the central initiating pulse causes a radially expanding cleave front to cleave the substrate.

The removed material region provides a thin film of silicon material for processing. The silicon material possesses limited surface roughness and desired planarity characteristics for use in a silicon-on-insulator substrate. In certain embodiments, the surface roughness of the detached film has features that are less than about 60 nm, or less than about 40 nm, or less than about 20 nm. Accordingly, the present invention provides thin silicon films which can be smoother and more uniform than pre-existing techniques.

In a preferred embodiment, the present invention is practiced at temperatures that are lower than those used by pre-existing techniques. In particular, the present invention does not require increasing the entire substrate temperature to initiate and sustain the cleaving action as pre-existing techniques. In some embodiments for silicon wafers and hydrogen implants, substrate temperature does not exceed about 400 Degrees Celsius during the cleaving process. Alternatively, substrate temperature does not exceed about 350 Degrees Celsius during the cleaving process. Alternatively, substrate temperature is kept substantially below implanting temperatures via a thermal sink, e.g., cooling fluid, cryogenic fluid. Accordingly, the present invention reduces a possibility of unnecessary damage from an excessive release of energy from random cleave fronts, which generally improves surface quality of a detached film(s) and/or the substrate(s). Accordingly, the present invention provides resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electro-statics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

A process for fabricating a silicon-on-insulator substrate according to the present invention may be briefly outlined as follows:

(1) Provide a donor silicon wafer (which may be coated with a dielectric material);
(2) Introduce particles into the silicon wafer to a selected depth to define a thickness of silicon film;
(3) Provide a target substrate material (which may be coated with a dielectric material);
(4) Bond the donor silicon wafer to the target substrate material by joining the implanted face to the target substrate material;
(5) Increase global stress (or energy) of implanted region at selected depth without initiating a cleaving action (optional);
(6) Provide stress (or energy) using a fluid jet to a selected region of the bonded substrates to initiate a controlled cleaving action at the selected depth;
(7) Provide additional energy to the bonded substrates to sustain the controlled cleaving action to free the thickness of silicon film from the silicon wafer (optional);
(8) Complete bonding of donor silicon wafer to the target substrate (optional);
(9) Finish surface of cleaved film by etching and hydrogen treatment;
(10) Form epitaxial layer (e.g., silicon, silicon germanium) overlying finished surface; and
(11) Perform remaining steps, if necessary.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. The steps are also used to finish the cleaved surface using a combination of etch and hydrogen treatment for silicon wafer, for example. This sequence of steps is merely an example and should not limit the scope of the claims defined herein. Further details with regard to the above sequence of steps are described in below in references to the Figs.

Figure 12:
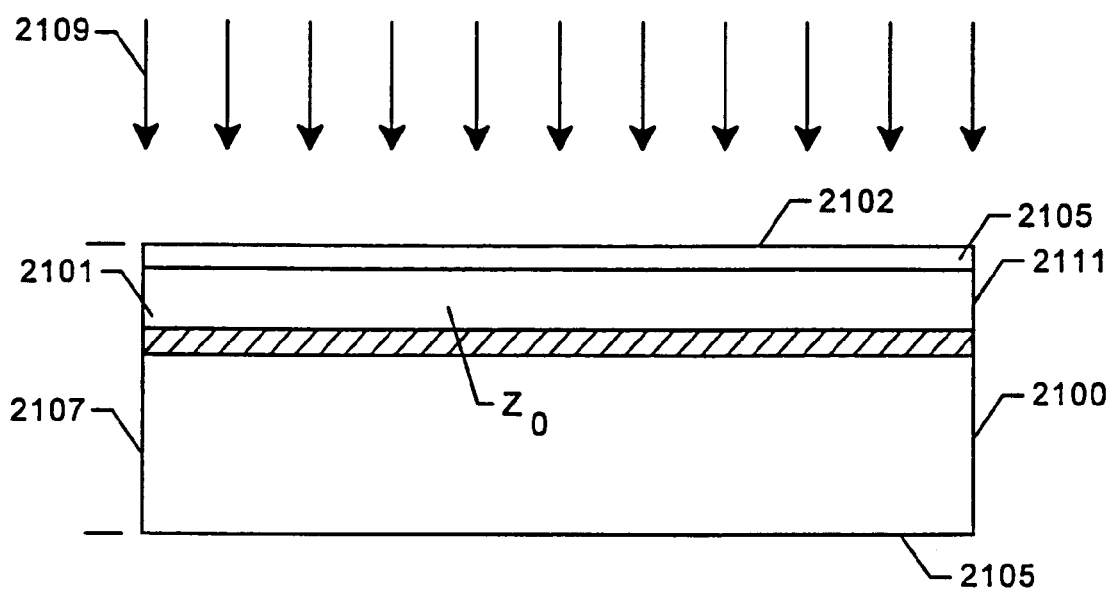
FIGS. 12–16 are simplified cross-sectional view diagrams illustrating a method of forming a silicon-on-insulator substrate according to the present invention.

FIGS. 12–16 are simplified cross-sectional view diagrams of substrates undergoing a fabrication process for a silicon-on-insulator wafer according to the present invention. The process begins by providing a semiconductor substrate similar to the silicon wafer 2100, as shown by FIG. 12. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for removing the material region 2101 using the following sequence of steps for the fabrication of a silicon-on-insulator wafer.

Selected energetic particles 2109 implant through the top surface of the silicon wafer to a selected depth, which defines the thickness of the material region, termed the thin film of material. As shown, the particles have a desired concentration 2111 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Furthermore, implantation can occur using ion shower. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

Figure 13:
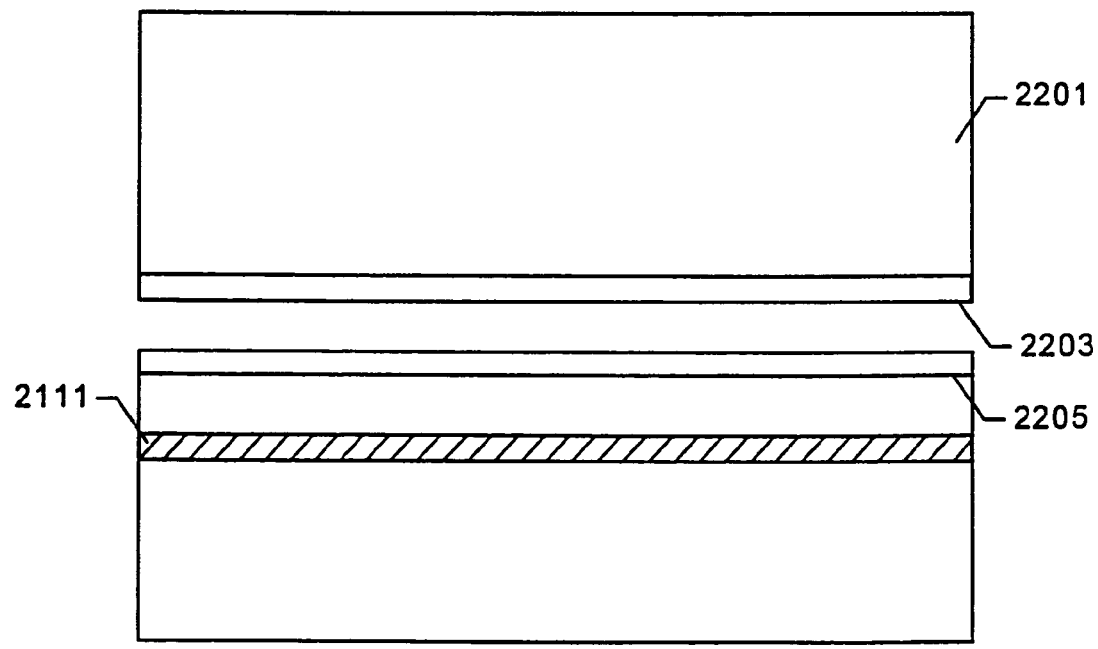

The process uses a step of joining the implanted silicon wafer to a workpiece or target wafer, as illustrated in FIG. 13. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250 Degrees Celsius) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 14:
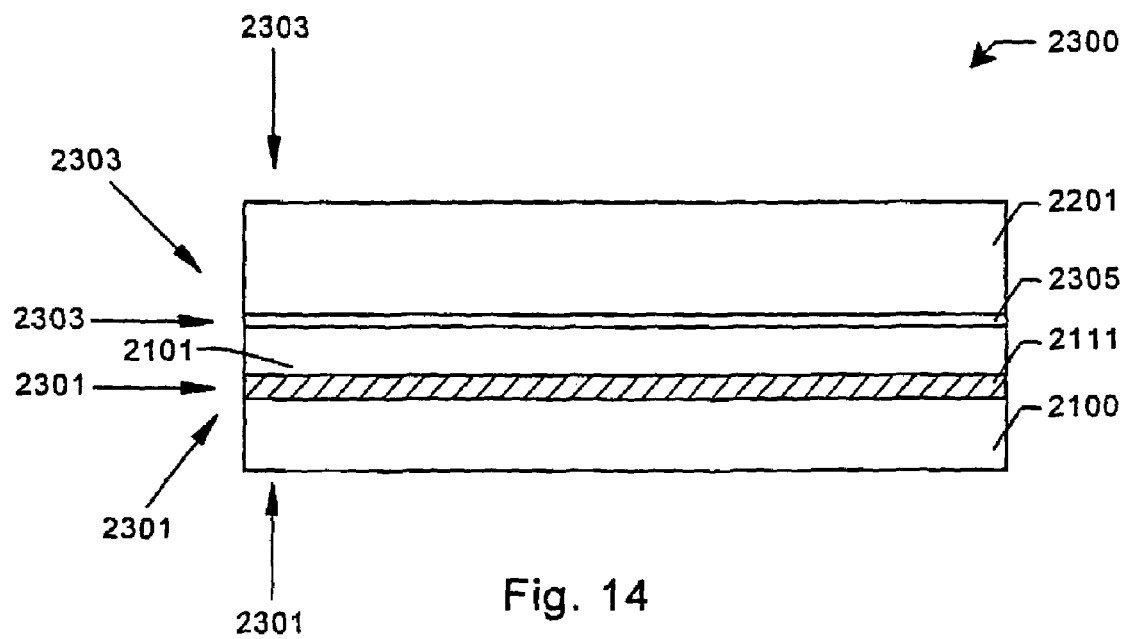

After bonding the wafers into a sandwiched structure 2300, as shown in FIG. 14, the method includes a controlled cleaving action to remove the substrate material to provide a thin film of substrate material 2101 overlying an insulator 2305 the target silicon wafer 2201. The controlled-cleaving occurs by way of selective energy placement or positioning or targeting 2301, 2303 of energy sources onto the donor and/or target wafers. For instance, an energy impluse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 14. For instance, a process for initiating the controlled cleaving action uses a step of providing energy 2301, 2303 to a selected region of the substrate to initiate a controlled cleaving action at the selected depth ($z_0$) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450 Degrees Celsius during the step of introducing energy to initiate propagation of the cleaving action. Substrate temperature can also be maintained at a temperature below 400 or below 350 Degrees Celsius. In preferred embodiments, the method uses a thermal sink to initiate and maintain the cleaving action, which occurs at conditions significantly below room temperature.

In an alternative preferred embodiment, the mechanical and/or thermal source can be a fluid jet that is pressurized (e.g., compressional) according to an embodiment of the present invention. The fluid jet (or liquid jet or gas jet) impinges on an edge region of substrate 2300 to initiate the controlled cleaving process. The fluid jet from a compressed or pressurized fluid source is directed to a region at the selected depth 2111 to cleave a thickness of material region 2101 from substrate 2100. The fluid jet separates region 2101 from substrate 2100 that separate from each other at selected depth 2111. The fluid jet can be adjusted to initiate and maintain the controlled cleaving process to separate material 2101 from substrate 2100. Depending upon the application, the fluid jet can be adjusted in direction, location, and magnitude to achieve the desired controlled cleaving process.

Figure 15:
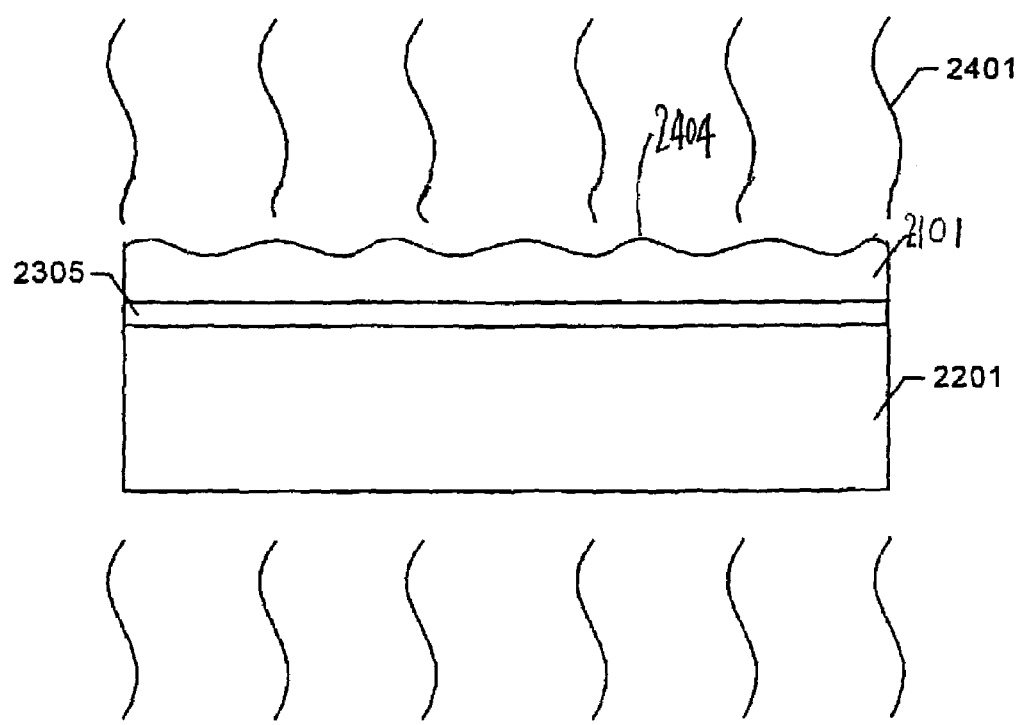

A final bonding step occurs between the target wafer and thin film of material region according to some embodiments, as illustrated by FIG. 15. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the target wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the two silicon wafers together at the oxide surface or interface 2305. These embodiments often require high temperatures (e.g., 700 Degrees Celsius).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 15. The detached surface of the film of silicon material is often rough 2404 and needs finishing. The rough surface for silicon wafers is often about two to eight nanometers RMS or greater. This roughness often should be removed before further processing. In a specific embodiment, the detached surface has a concentration of hydrogen bearing particles therein and thereon from the previous implanting step.

To smooth or treat surface 2404, the substrate is subjected to thermal treatment 2401 in a hydrogen bearing environment. Additionally, the substrate is also subjected to an etchant including a halogen bearing compound such as HCl, HBr, HI, HF, and others. The etchant can also be a fluorine bearing compound such as $SF_6$, $C_xF_x$.

In preferred embodiments, the present substrate undergoes treatment using a combination of etchant and thermal treatment in a hydrogen bearing environment. In a specific embodiment, the etchant is HCl gas or the like. The thermal treatment uses a hydrogen etchant gas. In some embodiments, the etchant gas is a halogenated gas, e.g., HCl, HF, HI, HBr, $SF_6$, $CF_4$, $NF_3$, and $CCl_2F_2$. The etchant gas can also be mixed with another halogen gas, e.g., chlorine, fluorine. The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius and greater or 20 Degrees Celsius and greater, depending upon the embodiment.

In one embodiment, it is believed that the hydrogen particles in the detached surface improves the surface smoothing process. Here, the hydrogen particles have been maintained at a temperature where they have not diffused out of the substrate. In a specific embodiment, the concentration of hydrogen particles ranges from about $10^{21}$ to about $5 \times 10^{22}$ atoms/$cm^3$. Alternatively, the concentration of hydrogen particles is at least about $6 \times 10^{21}$ atoms/$cm^3$. Depending upon the embodiment, the particular concentration of the hydrogen particles can be adjusted.

Figure 16:
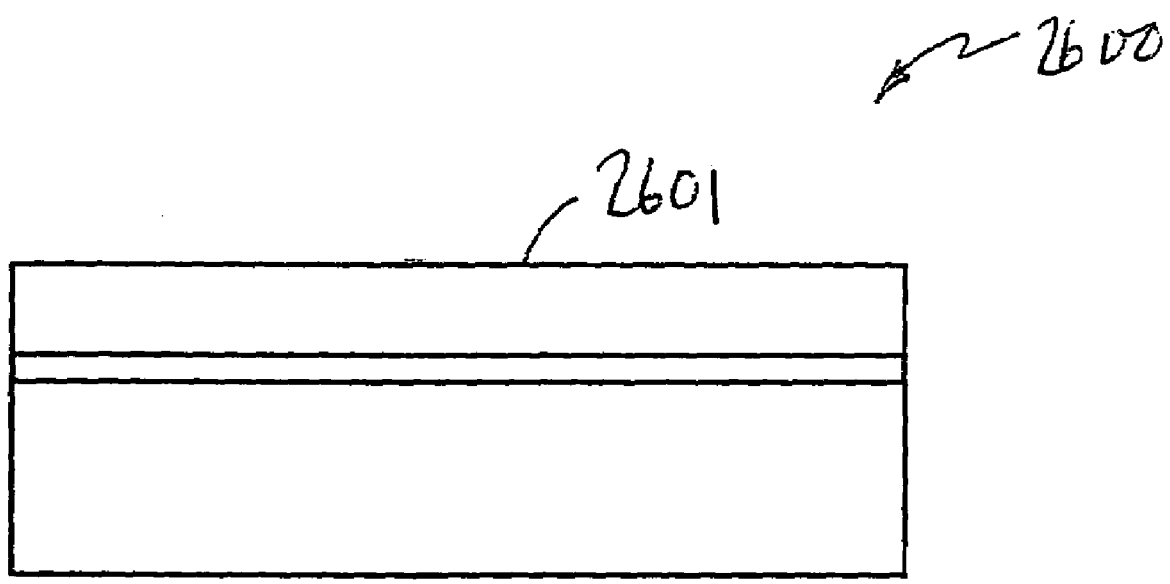

Still further in other embodiments, the present substrate undergoes a process of hydrogen treatment or implantation before thermal treatment purposes. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. The present hydrogen treatment process can occur for substrates made by way of the controlled cleaving process, Smart Cut™ by Soitec SA of France, and others, which may form an uneven or rough surface finish after detachment. A finished wafer after smoothing or surface treatment is shown in FIG. 16. Here, the finished wafer includes a substantially smooth surface 2601, which is generally good enough for the manufacture of integrated circuits without substantial polishing or the like.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., $Si_xCl_yH_z$, $SiH_4$, $SiCl_x$, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment. In some embodiments, the process is also maintained at about 1 atmosphere, but is not limited to this pressure.

In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. The substrate can also be bulk, epitaxial, and the like, and other layer transfer wafers, e.g., SIMOX. Other types of wafers that may include defects are wafers made by a Smart Cut™ process of Soitec SA and ELTRAN™ process by Canon. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

Although the above has been generally described in terms of a PIII system, the present invention can also be applied to a variety of other plasma systems. For example, the present invention can be applied to a plasma source ion implantation system. Alternatively, the present invention can be applied to almost any plasma system where ion bombardment of an exposed region of a pedestal occurs. Accordingly, the above description is merely an example and should not limit the scope of the claims herein. One of ordinary skill in the art would recognize other variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of fabricating substrates, the method comprising:
   providing a substrate comprising a film of material characterized by a non-uniform surface, the non-uniform surface including a plurality of defects, at least some of the defects being of a size ranging from about 100 Angstroms and greater; and
   applying a combination of a deposition species for deposition of a deposition material and an etching species for etching an etchable material during a portion of time that the non-uniform surface is subjected to the etching, the combination of the deposition species and the etching species contacting the non-uniform surface in a thermal setting to reduce a level of non-uniformity of the non-uniform surface by filling a portion of the defects to smooth the film of material, the film of material being substantially free from the defects and being characterized by a surface roughness of a predetermined value.

2. The method of claim 1 wherein said thermal setting increases a temperature of said non-uniform surface to about 1,000 Degrees Celsius and greater.

3. The method of claim 2 wherein said temperature increases is about 10 Degrees Celsius per second and greater.

4. The method of claim 2 wherein said temperature increases is about 20 Degrees Celsius per second and greater.

5. The method of claim 1 wherein said non-uniform surface comprises a plurality of particles therein, the particles comprising a hydrogen bearing species.

6. The method of claim 5 wherein said plurality of particles are derived from hydrogen gas during an implantation process.

7. The method of claim 1 wherein said predetermined value is less than about two nanometers root mean square.

8. The method of claim 1 wherein said predetermined value is less than about 1 nanometers root mean square.

9. The method of claim 1 wherein said predetermined value is less than about 0.1 nanometer root mean square.

10. The method of claim 1 wherein said etching species comprise a hydrogen bearing compound.

11. The method of claim 1 wherein said etching species comprise a halogen bearing compound.

12. The method of claim 1 wherein said etching species comprise a fluorine bearing compound.

13. The method of claim 12 wherein said fluorine bearing compound is selected from $SF_6$, $CF_4$, $NF_3$, and $CCl_2F_2$.

14. The method of claim 1 wherein said deposition species comprise a silane bearing gas.

15. The method of claim 1 wherein said deposition species comprise a silicon bearing species.

16. The method of claim 1 wherein said deposition species comprise a species selected from $SiH_4$, SixClyHz, and SiClx.

17. The method of claim 1 wherein the non-uniform surface is a cleaved surface, the cleaved surface being made from a process selected from a controlled cleaving action, a Smart Cut™ process, or an ELTRAN™ process.

18. The method of claim 1 wherein the defects are called HF defects.

19. The method of claim 1, wherein the substrate is a silicon substrate having a single crystal orientation.

20. A method of fabricating substrates, the method comprising
   providing a substrate comprising a film of material with a non-uniform surface, the non-uniform surface including a plurality of defects, at least some of the defects being 100 Angstroms or greater; and
   applying simultaneously to the non-uniform surface in a thermal setting a combination of a silicon-containing-deposition species for deposition of a deposition material and a halogen-containing-etching species for etching an etchable material in order to smooth the surface.

21. The method of claim 20, wherein the thermal setting is a temperature of about 1,000 degrees Celsius or greater.

22. A method of fabricating substrates, the method comprising
   providing a silicon substrate comprising a film of material with a non-uniform surface, the non-uniform surface including a plurality of defects, at least some of the defects being 100 Angstroms or greater, the silicon substrate having a single crystal orientation, the non-uniform surface including particles derived from hydrogen gas during an implantation process; and
   applying simultaneously to the non-uniform surface a combination of a silicon-containing-deposition species for deposition of a deposition material and a halogen-containing-etching species for etching an etchable material in order to smooth and reduce a level of non-uniformity of the non-uniform surface, the halogen-containing-etching species including HCl,
   wherein the combination of the deposition species and the etching species are contacting the non-uniform surface placed in a thermal setting of a temperature of about 1,000 degrees Celsius or greater.

23. A method of claim 1 wherein the etching species is gaseous HCl.

* * * * *